(12) United States Patent
Hasegawa et al.

(10) Patent No.: US 12,066,709 B2
(45) Date of Patent: Aug. 20, 2024

(54) LIQUID CRYSTAL DISPLAY DEVICE

(71) Applicant: Japan Display Inc., Tokyo (JP)

(72) Inventors: Shota Hasegawa, Tokyo (JP); Shinichiro Tanaka, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 18/081,777

(22) Filed: Dec. 15, 2022

(65) Prior Publication Data

US 2023/0194937 A1 Jun. 22, 2023

(30) Foreign Application Priority Data

Dec. 22, 2021 (JP) ................. 2021-207645

(51) Int. Cl.
*G02F 1/1335* (2006.01)
*G02F 1/1345* (2006.01)
*G02F 1/1362* (2006.01)
*G02F 1/1368* (2006.01)
*H01L 27/12* (2006.01)

(52) U.S. Cl.
CPC .... *G02F 1/133531* (2021.01); *G02F 1/13452* (2013.01); *G02F 1/13454* (2013.01); *G02F 1/13458* (2013.01); *G02F 1/136286* (2013.01); *G02F 1/1368* (2013.01); *G02F 2202/28* (2013.01); *H01L 27/124* (2013.01)

(58) Field of Classification Search
None
See application file for complete search history.

(56) References Cited

U.S. PATENT DOCUMENTS

| | | | | |
|---|---|---|---|---|
| 2015/0002779 | A1* | 1/2015 | Joten | ................. G02F 1/133308 349/59 |
| 2018/0101044 | A1* | 4/2018 | Oka | ..................... G02F 1/1339 |
| 2019/0310507 | A1 | 10/2019 | Yamada et al. | |
| 2021/0165266 | A1* | 6/2021 | Nakakomi | ........ G02F 1/133308 |

FOREIGN PATENT DOCUMENTS

| | | |
|---|---|---|
| JP | 2011-170200 A | 9/2011 |
| JP | 2014-098825 A | 5/2014 |
| JP | 2019-184721 A | 10/2019 |
| JP | 2021-089334 A | 6/2021 |

* cited by examiner

*Primary Examiner* — Dung T Nguyen
(74) *Attorney, Agent, or Firm* — Michael Best & Friedrich LLP

(57) ABSTRACT

A display area formed in an overlapping area of a TFT substrate and a counter substrate, a terminal area formed on the TFT substrate in which the counter substrate does not overlap, and a side of the counter substrate adjacent to the terminal area extending in a first direction, in which a basic potential terminal to be connected to a basic potential, and terminal wirings are formed in the terminal area, an IC driver is installed on the terminal area, an upper polarizing plate having a transparent conductive adhesive is adhered to the counter substrate, the upper polarizing plate extends in a direction perpendicular to the first direction, and covers a part of the terminal area, the basic potential terminal is electrically connected with the transparent conductive adhesive of the upper polarizing plate via a conductive element, and the upper polarizing plate covers the driver IC.

18 Claims, 17 Drawing Sheets

LIQUID CRYSTAL DISPLAY DEVICE

CLAIM OF PRIORITY

The present application claims priority from Japanese Patent Application JP 2021-207645 filed on Dec. 22, 2021, the content of which is hereby incorporated by reference into this application.

BACKGROUND OF THE INVENTION

(1) Field of the Invention

The present invention relates to a liquid crystal display device, especially to a structure for electrical shield of a surface of a display area.

A liquid crystal display device has a structure including a TFT substrate, in which pixels having pixel electrodes and TFTs (Thin Film Transistor) are arranged in matrix, a counter substrate opposing to the TFT substrate, and a liquid crystal layer sandwiched between the TFT substrate and the counter substrate. A light transmittance of each of the pixels is controlled by liquid crystal molecules in each of the pixels; thus, images are formed. Liquid crystal display devices are now being used in various area since liquid crystal display devices can be made small and light.

A liquid crystal display device has a problem in viewing angle. An IPS (In Plane Switching) mode liquid crystal display device can mitigate the problem of viewing angle; however, IPS does not have an electrode on a counter substrate according to its feature. Therefore, a conductive film is formed on a surface of the counter substrate, which is connected to a basic potential, to shield inside of the liquid crystal display panel.

Patent document 1 discloses to attach a polarizing plate having a conductive adhesive on a surface of a counter substrate. The side surface of the conductive adhesive is connected to a conductive resin formed on side surfaces of the liquid crystal panel and a back light; the conductive resin is electrically connected to a metal frame for the back light; thus the surface of the counter substrate is shielded.

Patent document 2 discloses to attach a polarizing plate having a transparent conductive film on a surface; a part of the polarizing plate extends to a flexible wiring substrate; a part of the polarizing plate is connected with a terminal for the basic potential formed in the flexible wiring substrate with a cupper film.

Patent document 3 discloses to form a transparent conductive film on an upper surface of the counter substrate; a periphery of the transparent conductive film and a terminal formed on a TFT substrate for a basic potential are connected with each other by coating a conductive substance, and the conductive substance is hardened.

Patent document 4 discloses to attach a polarizing plate having a conductive adhesive on a surface of a counter substrate, the polarizing plate is extended to a terminal side of a TFT substrate, the polarizing plate and the terminal for a basic potential formed on the TFT substrate are connected with each other by a conductive substance.

PRIOR ART REFERENCE

Patent Document

Patent document 1: Japanese patent application laid open No. 2021-089334

Patent document 2: Japanese patent application laid open No. 2014-098825

Patent document 3: Japanese patent application laid open No. 2011-170200

Patent document 4: Japanese patent application laid open No. 2019-184721

SUMMARY OF THE INVENTION

A conventional IPS mode liquid crystal display device (maybe called simply a liquid crystal display device herein after) has a following structure: an ITO (Indium Tin Oxide) film, which is a transparent conductive film, is formed on a surface of a counter substrate by sputtering; and the ITO film is connected to a terminal for a basic potential terminal formed on a TFT substrate. However, forming ITO by sputtering raises a manufacturing cost. In addition, even it is called as transparent conductive film, ITO film has some absorption of light.

In order to counter measure this problem, the following structure is proposed: that is to say, to add conductivity to an adhesive of the polarizing plate, which is attached to a surface of a counter substrate for shielding. However, a technology for connecting the conductive adhesive of the polarizing plate and a basic potential terminal formed on a TFT substrate with high reliability is not developed yet.

In addition, noise is emitted from a terminal area of the liquid crystal panel, in which a driver IC and various wirings are formed. A counter measure to the noise emitted from the terminal area has not been developed.

In a structure, in which a polarizing plate is attached to a counter substrate through a conductive adhesive to shield inside of a liquid crystal display panel, a purpose of the present invention is to realize a structure to connect the conductive adhesive and a basic potential terminal formed on the TFT substrate to each other with high reliability, and further, to suppress radiation noise from the terminal area of the liquid crystal display panel.

The present invention solves the above explained problems; the representative structures are as follows.

(1) A liquid crystal display device including: a TFT substrate and a counter substrate, a display area formed in an overlapping area of the TFT substrate and the counter substrate, a terminal area formed on the TFT substrate in which the counter substrate does not overlap, and a side of the counter substrate adjacent to the terminal area extending in a first direction, in which a basic potential terminal, which is to be connected to a basic potential, and terminal wirings are formed in the terminal area, an IC driver is installed on the terminal area, an upper polarizing plate having a transparent conductive adhesive is adhered to the counter substrate, the upper polarizing plate extends in a direction perpendicular to the first direction, and covers a part of the terminal area, the basic potential terminal is electrically connected with the transparent conductive adhesive of the upper polarizing plate via a conductive element, and the upper polarizing plate covers the driver IC.

(2) A liquid crystal display device including: a TFT substrate and a counter substrate, a display area formed in an overlapping area of the TFT substrate and the counter substrate, a terminal area formed on the TFT substrate in which the counter substrate does not overlap, and a side of the counter substrate adjacent to the terminal area extending in a first direction, in which a basic potential terminal, which is to be connected to a basic potential, and terminal wirings are formed in the terminal area, an upper polarizing plate having a transparent conductive adhesive is adhered to the counter substrate, the upper polarizing plate extends in a direction perpendicular to the first direction, and covers a part of the terminal area, the basic potential terminal is electrically connected with the transparent conductive adhesive of the upper polarizing plate via a conductive element, an organic passivation film is formed on the terminal wrings, the conductive element exists between the transparent conductive adhesive of the upper polarizing plate and the organic passivation film, and the conductive element is formed continuously, in the first direction, from a first side to a second side of the terminal area.

DETAILED DESCRIPTION OF THE PREFERRED EMBODIMENTS

Figure 1:
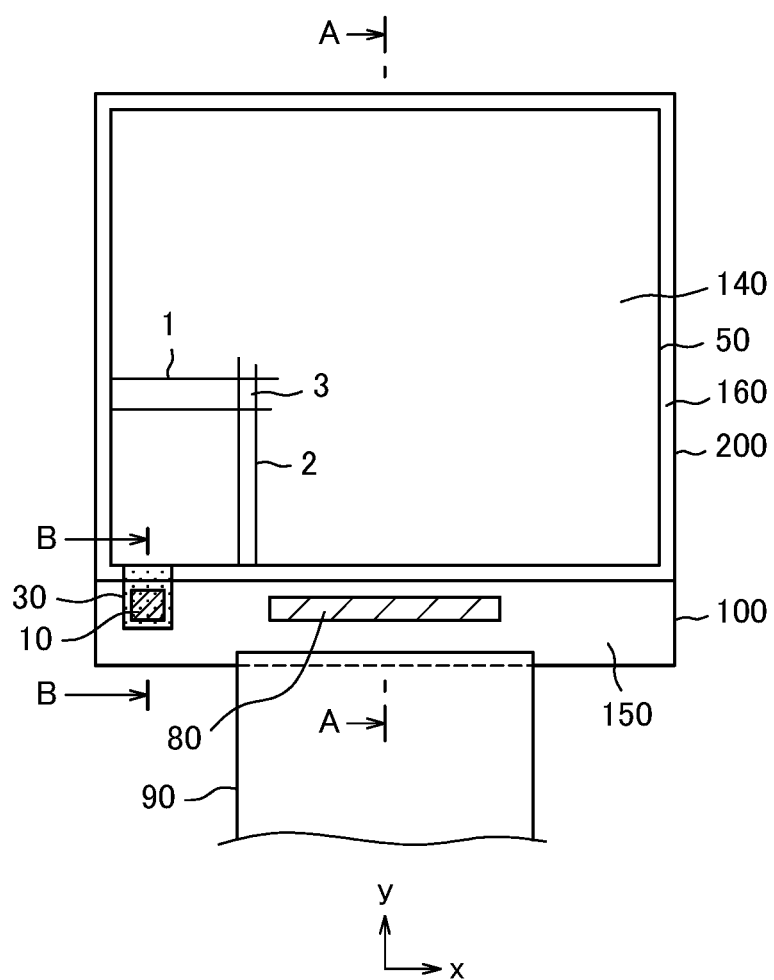
FIG. 1 is a plan view of a liquid crystal display device which does not use the present invention.

FIG. 1 is a plan view of a general liquid crystal display device. In FIG. 1, a TFT substrate 100 and a counter substrate 200 are adhered by seal material 160, a liquid crystal material is sealed therein. An upper polarizing plate 50 is adhered on an upper surface of the counter substrate 200. In FIG. 1, an outer size of the upper polarizing plate 50 is slightly smaller than an outer size of the counter substrate 200. A display area 140 is formed in an area where the counter substrate 200 and the TFT substrate 100 overlap each other.

In the display area 140, scan signal lines 1 extend in lateral direction (x direction) and are arranged in longitudinal direction (y direction); video signal lines 2 extend in longitudinal direction (y direction) and are arranged in lateral direction (x direction). A pixel 3 is formed in an area surrounded by the scan signal lines 1 and the video signal lines 2.

The TFT substrate 100 is made larger than the counter substrate 200; a terminal area 150 is formed in an area where the TFT substrate 100 does not overlap the counter substrate 200. A driver IC 80 is installed on the terminal area 150, and a flexible wiring substrate 90, which supplies power and signals to the liquid crystal display device, is connected to the terminal area 150. Since liquid crystal is not self-luminous, a back light is disposed at rear side of the liquid crystal display panel.

The upper polarizing plate 50 is attached to a surface of the counter substrate 200 through a transparent conductive adhesive formed at a back side of the upper polarizing plate 50. Since the transparent conductive adhesive covers entire surface of the counter substrate 200, inside of the liquid crystal panel is electrically shielded. However, the transparent conductive film must be connected to a basic potential for shield effect. For this purpose, a terminal 10 for the basic potential is formed on the TFT substrate 100, and a conductive past 30 such as silver paste is used to connect the transparent conductive film and the terminal 10 for the basic potential with each other.

Figure 2:
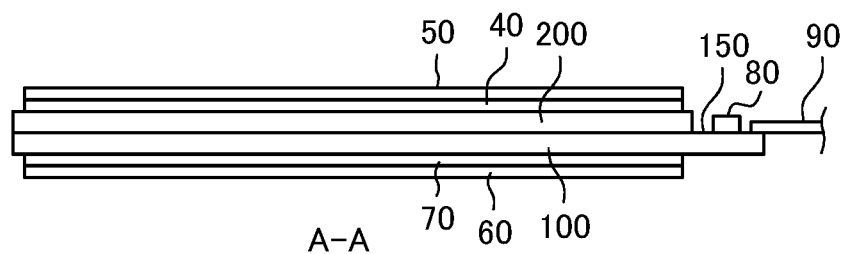
FIG. 2 is a cross sectional view of FIG. 1 along the line A-A.

FIG. 2 is a cross sectional view of FIG. 1 along the line A-A. In FIG. 2, the TFT substrate 100 and the counter substrate 200 are adhered through seal material and liquid crystal is sealed between the TFT substrate 100 and the counter substrate 200. The driver IC 80 is installed on the terminal area 150 and the flexible wring substrate 90 is connected to the terminal area 150. A lower polarizing plate 60 is adhered to a bottom side of the TFT substrate 100 through adhesive 70. The adhesive 70 is not necessarily to be conductive. The upper polarizing plate 50 is adhered to a top side of the counter substrate 200 through transparent conductive adhesive 40. The transparent conductive adhesive 40 has a role to shield electrically the liquid crystal display panel.

Figure 3:
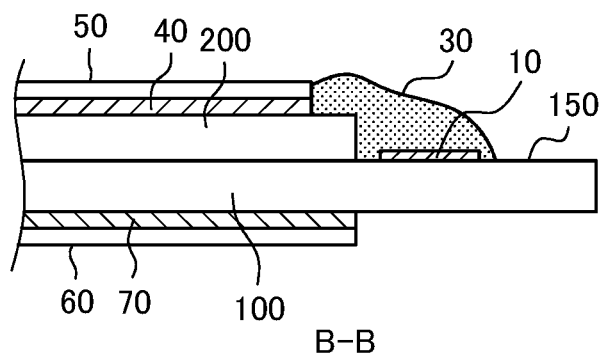
FIG. 3 is a cross sectional view of FIG. 1 along the line B-B.

FIG. 3 is a cross sectional view of FIG. 1 along the line B-B, which is a cross sectional view at the terminal 10 to connect the transparent conductive adhesive 40 to the basic potential. In FIG. 3, the basic potential terminal 10, which is connected to the basic potential, is formed on the TFT substrate 100. A side surface of the transparent conductive adhesive 40 and the basic potential terminal 10 are connected with each other by conductive paste 30 such as silver paste.

In the structure of FIG. 3, a connection between the basic potential terminal 10 and the transparent conductive film 40 depends on a contact between the side surface of the transparent conductive adhesive 40 and the conductive past 30, thus, increasing in contact area is difficult; consequently, a problem of a reliability of connection arises. In addition, a connecting resistance also tends to be larger.

The purpose of the present invention is to realize a connection between the transparent conductive adhesive 40, which is for attaching the upper polarizing plate 50 to the counter substrate 200, and the basic potential terminal 10 formed on the TFT substrate 100 with high reliability. The present invention has specific structure in the terminal area 150; however, since the structure of the terminal area 150 is simultaneously formed with the structure of the display area 140, the cross sectional structure of the display area 140 is explained at the outset.

Figure 4:
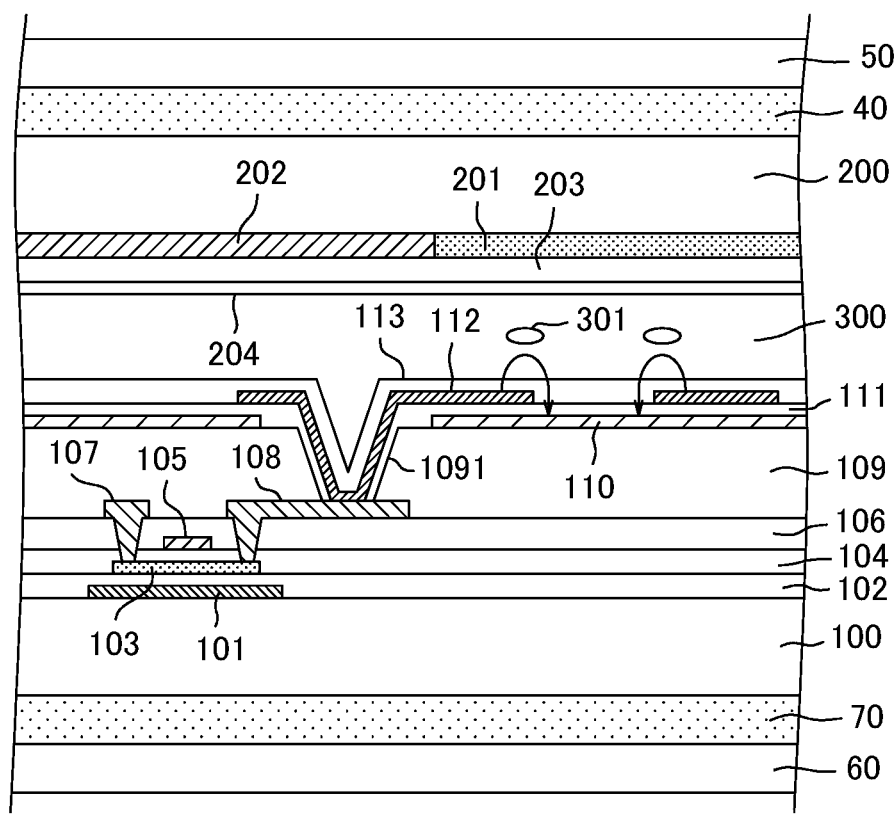
FIG. 4 is a cross sectional view of a display area of a liquid crystal display device.

FIG. 4 is a cross sectional view of an IPS mode liquid crystal display device. In FIG. 4, a light shading film 101 is formed by metal on the TFT substrate 100; an under coat 102 is formed by a SiO film and a SiN film over the light shading film 101. The semiconductor film 103 is formed on the under coat 102. The semiconductor film 103 is formed from e.g. oxide semiconductor or polysilicon semiconductor.

A gate insulating film 104 is formed covering the semiconductor film 103; gate electrode 105 is formed on the gate insulating film 104. The gate electrode 105 is connected with the scan signal line 1. An interlayer insulating film 106 is formed covering the gate electrode 105. A drain electrode 107 and a source electrode 108 are formed on the interlayer insulating film 106. The drain electrode 107 is connected with the video signal line 2, and connected with a drain region of the semiconductor film 103 via a through hole. The source electrode 108 is connected with a source region of the semiconductor 103 via a through hole.

In FIG. 4, an organic passivation film 109 is formed covering the drain electrode 107, the source electrode 108, and so forth. Since the organic passivation film 109 has a role to be a flattening film and a role to decrease a floating capacitance, it is made thick as 2 to 4 μm. A common electrode 110 is formed in a plane shape by ITO or the like on the organic passivation film 109. A capacitance insulating film 111 is formed by SiN or the like on the common electrode 110; a pixel electrode 112 is formed by ITO or the like on the capacitance insulating film 111.

The pixel electrode 112 is connected with the source electrode 108 via through hole 1091 formed in the passivation film 109. An alignment film 113 is formed covering the pixel electrode 112 for initial alignment of the liquid crystal molecules 301. A counter substrate 200 is disposed opposing to the TFT substrate 100 sandwiching the liquid crystal layer 300. Black matrix 202 and color filters 201 are formed on the counter substrate 200 and an overcoat film 203 is formed on the black matrix 202 and the color filters 201. An alignment film 204 is formed on the over coat film 203.

In FIG. 4, when a voltage of a video signal is applied to the pixel electrode 112, a line of force as depicted in FIG. 4 is generated and the liquid crystal molecules 301 are rotated, thus, a transmittance of the liquid crystal layer 300 is changed. An image is formed by changing a transmittance of the liquid crystal layer in every pixels. Since the liquid crystal molecules 301 can control only a polarized light, a lower polarizing plate 60 is disposed on a bottom surface of the TFT substrate 100 as depicted in FIG. 4 to pass only polarized light in certain direction of the light from the back light. The light is analyzed by the upper polarizing plate 50 attached to the counter substrate 200.

As shown in FIG. 4, since an electrode is not formed on the counter substrate 200, noise from outside is not shielded. Conventionally, ITO is formed on the counter substrate 200 by sputtering to shield inside of the liquid crystal display panel; however, a cost of forming ITO by sputtering and an increase in a reflection by the ITO have been a problem.

In order to counter measure this problem, a technology has been developed as that the upper polarizing plate 50 having a transparent conductive adhesive 40 is attached to the counter substrate 200, and the transparent conductive adhesive 40 is connected to the basic potential. According to this method, a process of sputtering ITO on the counter substrate 200 is eliminated.

An important characteristic of the conductive adhesive 40, in addition to the conductivity, is a lower reflectance to light. A light reflection of the conductive adhesive 40 can be lower than that of ITO. By the way, since various wirings are formed on the TFT substrate 100, an outer shield electrode is not necessary outside of the TFT substrate 100. Therefore, the adhesive 70 for attaching the lower polarizing plate 60 is not necessary to be conductive in FIG. 4.

The transparent conductive adhesive 40, which is for attaching the upper polarizing plate 50 on the counter substrate 200, is necessary to be connected to a basic potential to be effective for shielding. Concretely, the upper polarizing plate 50 and the transparent conductive adhesive 40 for attaching the upper polarizing plate 50 to the counter substrate 200 are formed on the surface of the counter substrate 200; the transparent conductive adhesive 40 is necessary to be connected to the basic potential terminal 10 formed on the TFT substrate 100. The present invention realizes a reliable connection structure between the transparent conductive adhesive 40 of the upper polarizing plate 50 and the basic potential terminal 10 of the TFT substrate 100.

Embodiment 1

Figure 8:
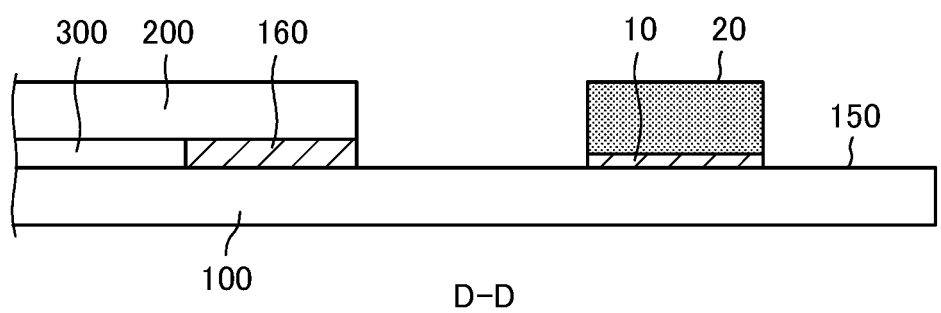
FIG. 8 is a cross sectional view of FIG. 7 along the line D-D.
Figure 9:
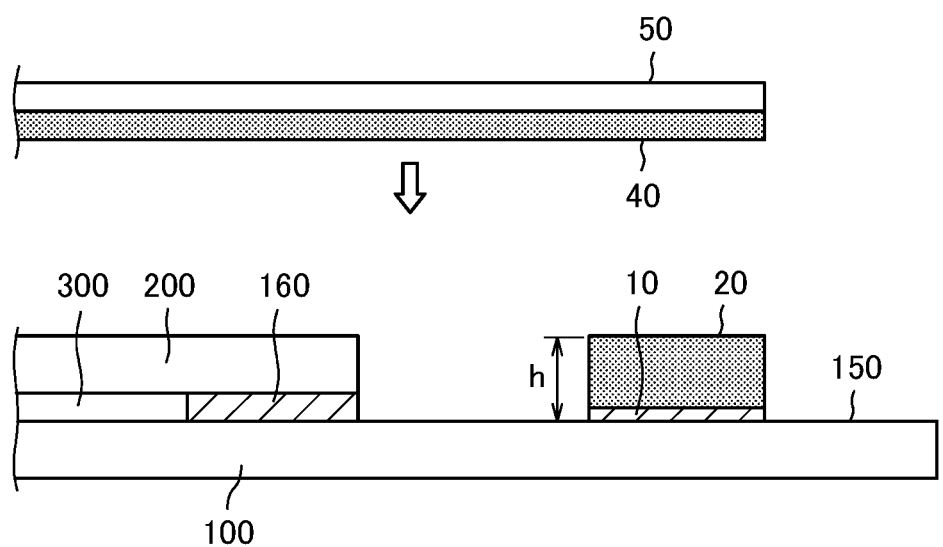
FIG. 9 is a plan view of a third process of embodiment 1.
Figure 10:
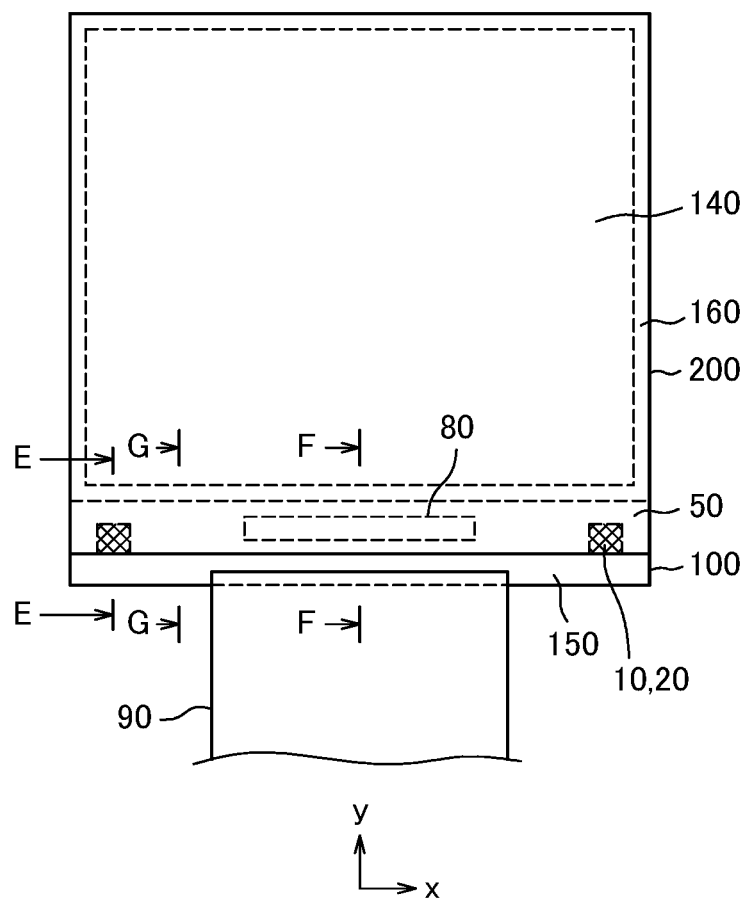
FIG. 10 is a plan view of a liquid crystal display device according to embodiment 1.

The structure of embodiment 1 is explained referring FIGS. 5 to 13. FIG. 10 is a plan view of a liquid crystal display device according to embodiment 1. In FIG. 10, the upper polarizing plate 50 having the transparent conductive adhesive 40 extends up to cover the basic potential terminal 10 on the TFT substrate 100; the basic potential terminal 10 is connected to the transparent conductive adhesive 40 of the upper polarizing plate 50 with conductive element 20. Various conductive adhesives, conductive adhesive paste of thermosetting resin, UV (Ultra Violet) curing resin and so forth are used for the conductive element 20. In this embodiment, at the outset, using conductive adhesive as the conductive element 20 is explained.

Figure 5:
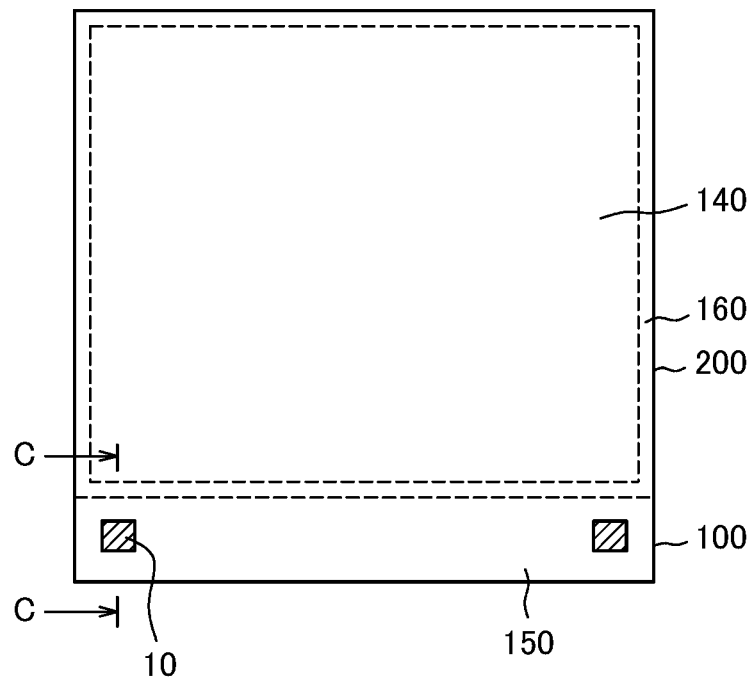
FIG. 5 is a plan view of a first process of embodiment 1.
Figure 6:
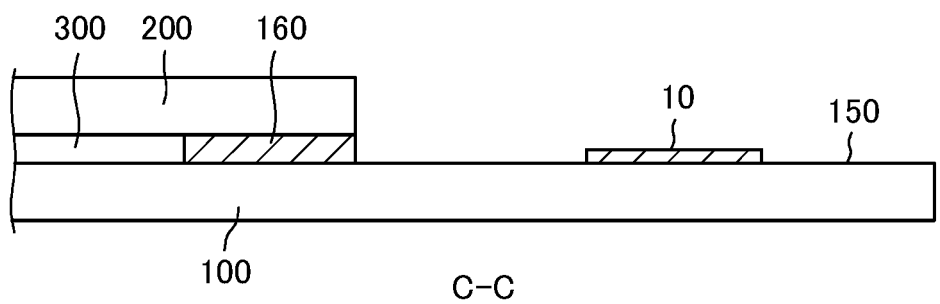
FIG. 6 is a cross sectional view of FIG. 5 along the line C-C.

FIG. 5 is a plan view, in which the basic potential terminal 10 is formed on the terminal area 150. The basic potential terminal 10 has a structure that a metal terminal is covered by oxide conductive film such as ITO; the structure of the basic potential terminal 10 is explained later in detail. Two basic potential terminals 10 are formed on the terminal area 150. FIG. 6 is a cross sectional view of FIG. 5 along the line C-C. Detailed structure is omitted in FIG. 6.

Figure 7:
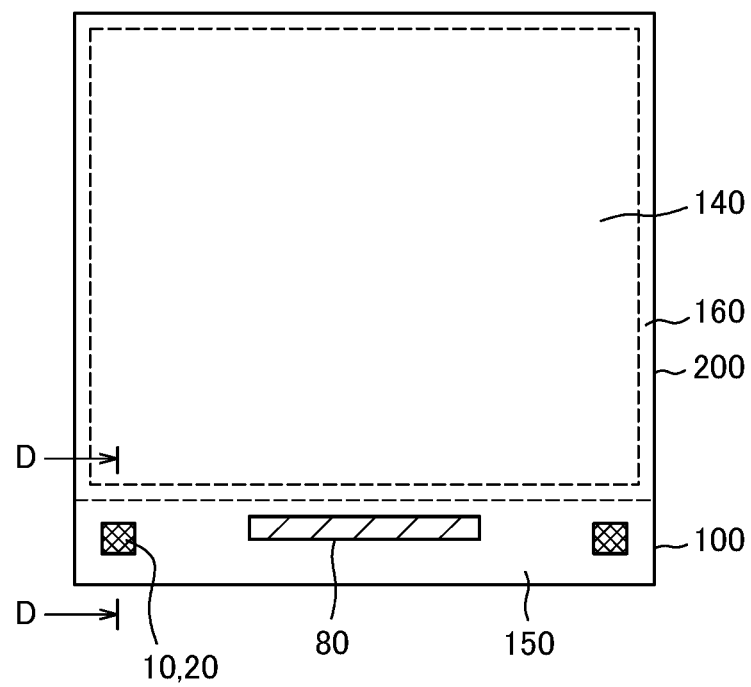
FIG. 7 is a plan view of a second process of embodiment 1.

The terminal area 150 is formed simultaneously with the structure of the display area 140 explained in FIG. 4. FIG. 7 is a plan view in which the conductive element (conductive adhesive) 20, which is approximately the same size as the basic potential terminal 10, is adhered to the basic potential terminal 10. In FIG. 7, a driver IC 80 is disposed on the terminal area 150 via ACF (Anisotropic Conductive Film) by thermal bonding. Either one of disposing the conductive element 20 and disposing the driver IC 80 by thermal bonding can precede the other.

FIG. 8 is a cross sectional view of FIG. 7 along the line D-D. In FIG. 8, the conductive element 20 is adhered to the basic potential terminal 10. The conductive element 20 and the transparent conductive adhesive 40 of the upper polarizing plate 50 are to connect to each other. Since the upper polarizing plate 50 is rather hard material, it is preferable to form the conductive element 20 thick so that bending stress is not generated in the upper polarizing plate 50. The lower polarizing plate is omitted in FIG. 8.

As to a material of the conductive element 20, it is best to choose the same material as the transparent conductive film 40; it is because a reliability of adhesiveness is highest; in addition, quality control of materials is easy. In general, as to a material of the conductive element 20, electro conductive acrylic resin, for example, can be listed as a conductive element 20, in which resin itself is conductive. Another type of conductive resin can be formed by dispersing fine conductive particles in an acrylic resin. Conductive fine particles can be formed from metal particle such as silver, nickel, aluminum, and copper. In the meantime, since the conductive element 20, which is formed in the terminal area 150, is not necessary to be transparent, carbon particles such as graphite particles can be used in addition to the metal particles.

In FIG. 8, a space between the counter substrate 200 or the seal material 160 and the basic potential terminal 10 can be used as a space for terminal wirings. An outer area from the basic potential terminal 10 can be used, for example, as a space for inspection terminals.

FIG. 9 is a cross sectional view, in which the polarizing plate 50 is being adhered to the structure of FIG. 8. FIG. 9 corresponds to the cross sectional view of FIG. 7 along the line D-D. In FIG. 9, a thickness of the conductive element 20 is set to have enough thickness to avoid an excessive bending stress in the upper polarizing plate 50 after adhering to the conductive element 20 or to avoid peeling stress between the upper polarizing plate 50 and the conductive element 20.

Figure 12:
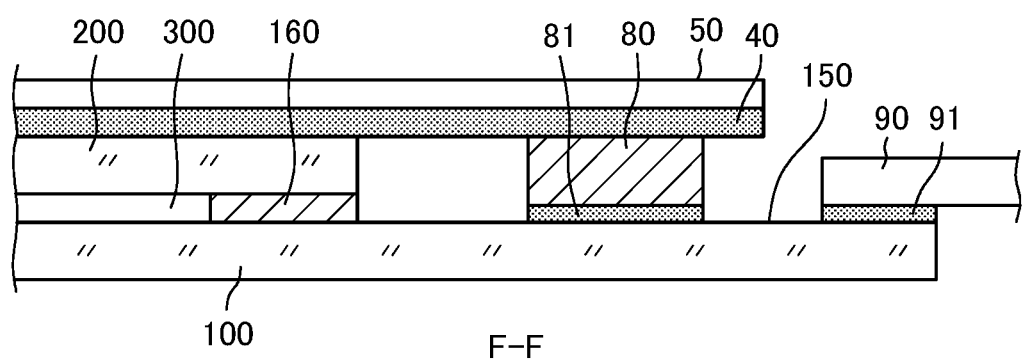
FIG. 12 is a cross sectional view of FIG. 10 along the line F-F.

Concretely, a height h of the conductive element 20 from a surface of the glass surface of the TFT substrate 100 is equal to or larger than a thickness of the transparent conductive adhesive 40 and smaller than a thickness of the counter substrate 200. In the present invention, the upper polarizing plate 50 covers the driver IC 80 as depicted in FIGS. 10, 12, and the like; therefore, the height h of the conductive element is preferably equal to or lower than a height of the IC driver 80 from the glass substrate of the TFT substrate 100. When it is difficult to form the height h of the conductive element in such thickness, it is preferable to form a half or larger than the thickness of the counter substrate 200.

FIG. 10 is a plan view of the liquid crystal display device according to the above explained structure. In FIG. 10, the upper polarizing plate 50 covers not only the counter substrate 200 but also extends to the terminal area 150 to cover the basic terminal 10 and the driver IC 80. The transparent conductive adhesive 40 of the upper polarizing plate 50 is electrically connected to the conductive element 20 and the basic potential terminal 10, consequently, works as a shield element for the entire counter substrate 200. In FIG. 10, since a contact between the conductive element 20 and the transparent conductive film 40 is a surface contact, it is possible to provide enough contact area; consequently, a reliability of connection is high. In FIG. 10, an outer edge in y direction of the conductive element 20 or the basic potential terminal 10 coincides with an outer edge in y direction of the upper polarizing plate 50.

Another feature of the structure of FIG. 10 is that the transparent conductive adhesive 40 of the upper polarizing plate 50 covers the driver IC 80. In the driver IC 80, scan signals and crock signals, which have a large amplitude, are generated; in other words, the driver IC 80 can be a source of noise. In the structure of FIG. 10, the noise from the driver IC 80 can be shielded by covering the driver IC 80 with the transparent conductive adhesive 40 of the upper polarizing plate 50.

Figure 11:
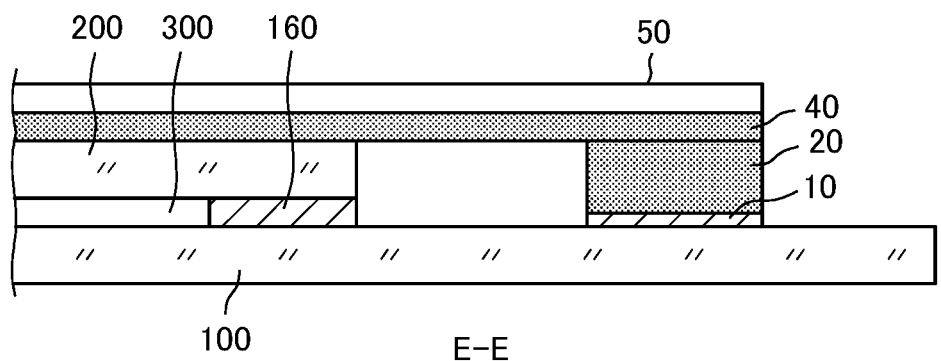
FIG. 11 is a cross sectional view of FIG. 10 along the line E-E.

FIG. 11 is a cross sectional view of FIG. 10 along the line E-E. The structure of FIG. 11 is the same as that explained for the structures of FIGS. 8 and 9. In FIG. 11, a space between the counter substrate 200 and the basic potential terminal 10 can be used for various wirings. Some of the wirings can be a noise source, however, this noise can be shielded by the transparent conductive adhesive 40 of the upper polarizing plate 50.

FIG. 12 is a cross sectional view of FIG. 10 along the line F-F. In FIG. 12, the driver IC 80 is connected to the terminal area 150 via an ACF (Anisotropic Conductive Film). The upper polarizing plate 50 extends to the terminal area 150 from the counter substrate 200, and covers the driver IC 80. The transparent conductive adhesive 40 of the upper polarizing plate 50 adheres to the top surface of the driver IC 80. The transparent conductive adhesive 40 can adhere to the driver IC 80 as strong as to the counter substrate 200. Since a height of the driver IC 80 can be as high as a height of the counter substrate 200, adjustment of the height of the driver IC 80 is not necessary.

Noise from the driver IC 80 can be shielded by the transparent conductive adhesive 40, which is connected to the basic potential. In FIG. 12, the edge of the driver IC 80 is inner side than the edge of the upper polarizing plate 50 to thoroughly shield the noise from the driver IC 80; however, the edge of the driver IC 80 and the edge of the polarizing plate 50 can coincide.

In FIG. 12, the flexible wiring substrate 90 is connected to terminals formed in the terminal area 150 through ACF 91 at the edge of the terminal area 150. Since the upper polarizing plate 50 does not cover the area to which the flexible wiring substrate 90 is connected, the flexible wiring substrate 90 can be connected after the upper polarizing plate 50 is adhered. If there is a necessity of thermal bonding processes of the driver IC 80 or the flexible wiring substrate 90, adhering the upper polarizing substrate 50 can be adhered after bonding of the flexible wiring substrate 90.

Figure 13:
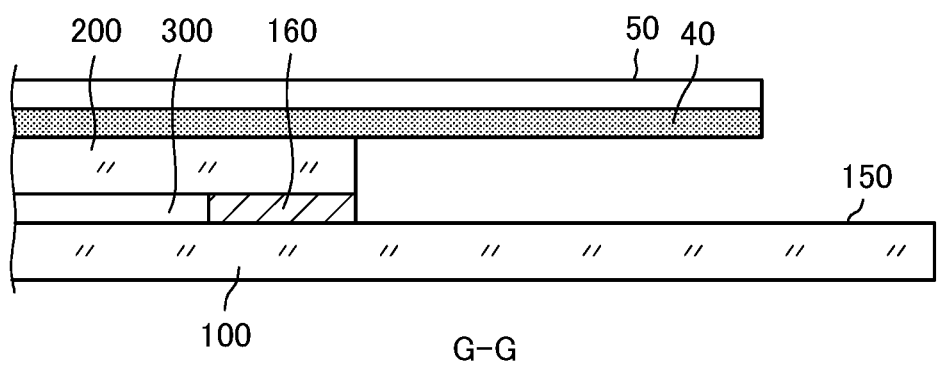
FIG. 13 is a cross sectional view of FIG. 10 along the line G-G.

FIG. 13 is a cross sectional view of FIG. 10 along the line G-G. In FIG. 13, an eaves of the upper polarizing plate 50 and the transparent conductive adhesive 40 covers the terminal area 150. There are many terminal wirings in the terminal area 150, the noise emitted from those wirings can be shielded by the transparent conductive adhesive 40, which is connected to the basic potential.

As described above, inside of the liquid crystal panel can be thoroughly shielded by the transparent conductive adhesive 40 of the upper polarizing plated 50. In addition, it is also possible to shield the noise from the driver IC 80 and the terminal wirings by the transparent conductive adhesive 40 of the upper polarizing plated 50.

Embodiment 2

Figure 14:
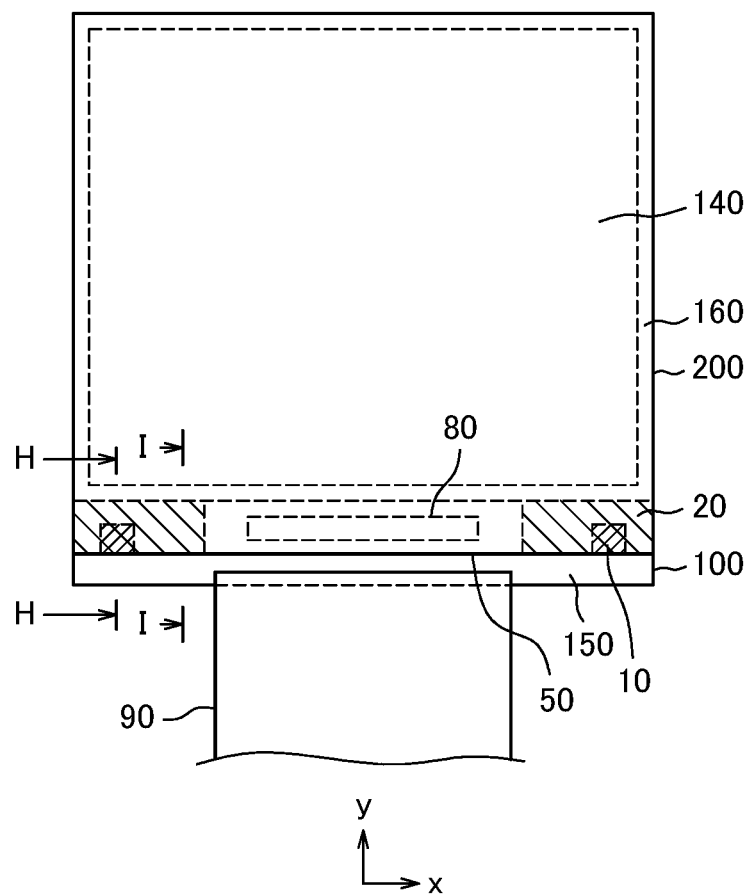
FIG. 14 is a plan view of the liquid crystal display device according to embodiment 2.

FIG. 14 is a plan view of the liquid crystal display device according to embodiment 2. The structure of FIG. 14 differs from the structure of FIG. 10 in that an area of the conductive element 20, which covers the basic potential terminal 10, is larger than an area of the basic potential terminal 10. In FIG. 10 of embodiment 1, the area of the conductive element 20 is approximately the same as the area of the basic potential terminal 10. In the structure of FIG. 10, an adhesive strength between the transparent conductive adhesive 40 of the upper polarizing plate 50 and the conductive element 20, even those are surface contact, may not be enough in some cases. In addition, as shown in FIG. 13, an edge of the eaves of the upper polarizing plate 50 may be unstable in embodiment 1; therefore, there is a danger that a peeling off of the upper polarizing plate 50 could occur beginning from this edge.

In embodiment 2, as shown in FIG. 14, an area of the conductive element 20 is made substantially larger than an area of the basic potential terminal 10, thus, a danger of peeling off of the upper polarizing plate 50 is further suppressed. Concretely, "substantially larger" means that a width of the conductive element 20 in x direction in FIG. 14 is made two times, preferably three times, more preferably five times of a width of the basic potential terminal 10 in x direction; x direction may be expressed as an extending direction of the side of the counter substrate 200 adjacent to the terminal area 150. Further, a width of the conductive element 20 in y direction in FIG. 14 is made to cover from the edge of the counter substrate 200 to the edge of the basic potential terminal 10 and an entire of the basic potential terminal 10; y direction may be expressed as a direction perpendicular to an extending direction of the side of the counter substrate 200 adjacent to the terminal area 150.

Figure 15:
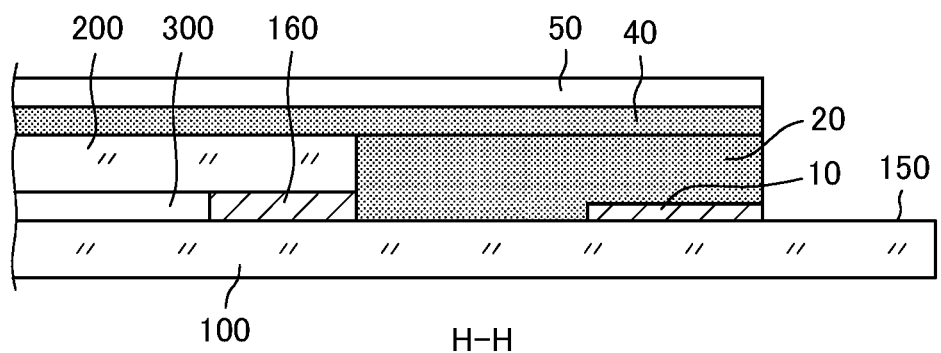
FIG. 15 is a cross sectional view of FIG. 14 along the line H-H.
Figure 16:
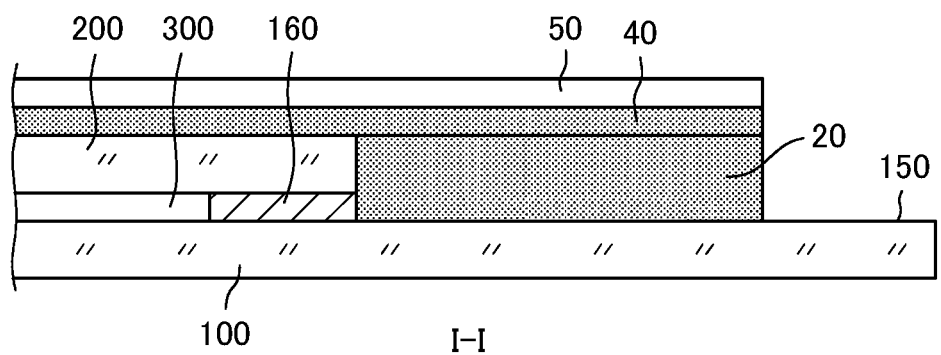
FIG. 16 is a cross sectional view of FIG. 14 along the line I-I.

FIG. 15 is a cross sectional view of FIG. 14 along the line H-H. In FIG. 15, differently from FIG. 11 of embodiment 1, the conductive element 20 covers an area between the edge of basic potential terminal 10, which coincides with the edge of the upper polarizing plate 50, and the edge of the counter substrate 200. Therefore, the contact area between the upper polarizing plate 50 and the conductive element 20 can be enlarged, consequently, reliability in adhering can be improved. FIG. 16 is a cross sectional view of FIG. 14 along the line I-I. In FIG. 16, differently from FIG. 13 of embodiment 1, the conductive element 20 covers an area between the edge of the counter substrate 200 and the edge of the upper polarizing plate 50. Therefore, the upper polarizing plate 50 can be fixed stably up to the edge.

Figure 17:
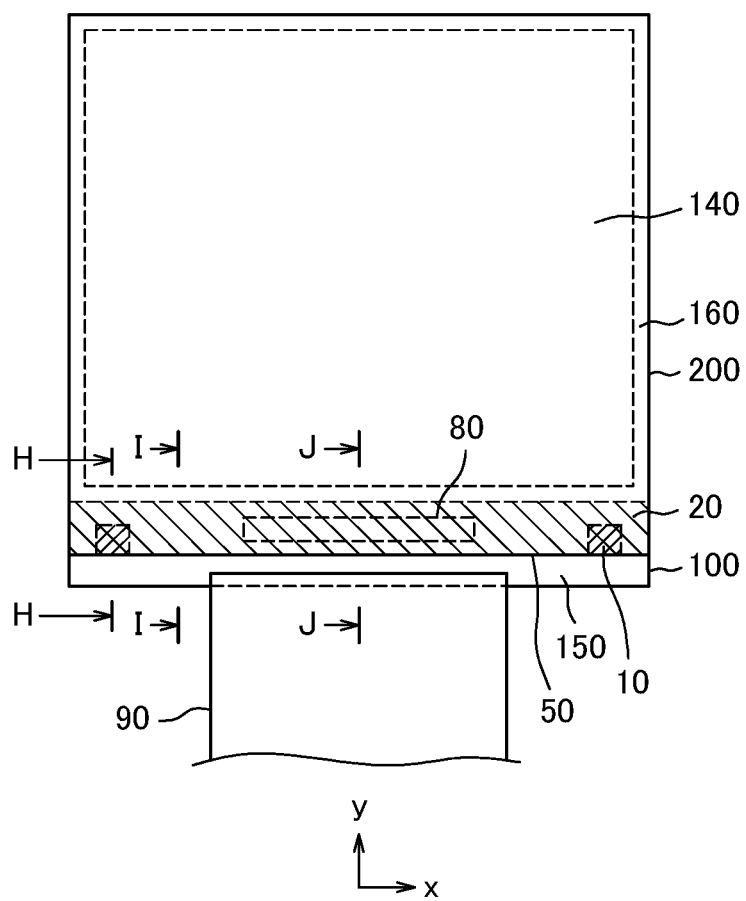
FIG. 17 is a plan view of the liquid crystal display device according to another example of embodiment 2.
Figure 18:
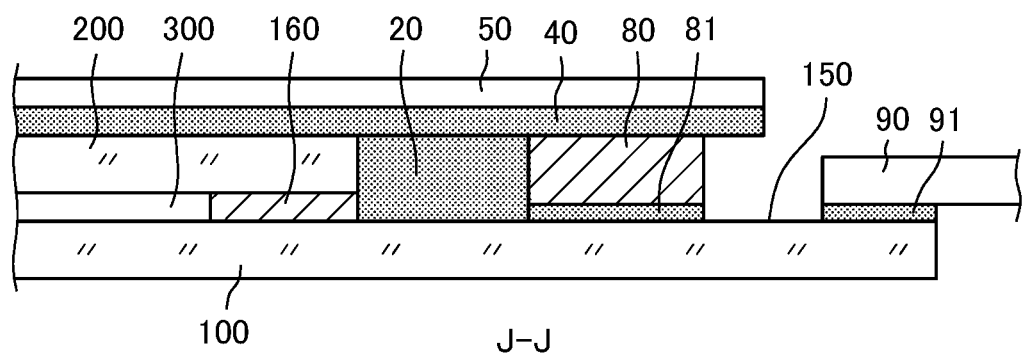
FIG. 18 is a cross sectional view of FIG. 17 along the line J-J.

FIG. 17 is a plan view of a liquid crystal display device according to a second example of embodiment 2. FIG. 17 differs from FIG. 14 in that the conductive element 20 exists entire space between the upper polarizing plate 50 and the terminal area 150 except the area in which the driver IC 80 exists. FIG. 18 is a cross sectional view of FIG. 17 along the line J-J. As shown in FIG. 18, the conductive element 20 exists between the edge of the driver IC 80 and the edge of the counter substrate 200.

The driver IC 80 is connected via ACF 81; since the ACF does not have conductivity in lateral direction, there is no insulation problems even when the conductive element 20 contacts the ACF 81, as far as the conductive element 20 does not contact a bump of the driver IC 80. In FIG. 18, the eaves of the upper polarizing plate 50 extends beyond the edge of the conductive element 20 to shield more effectively, however, this eaves can be omitted.

As described above, according to embodiment 2, the adhering strength between the transparent conductive film 40 of the upper polarizing plate 50 and the conductive element 20 can be improved; consequently, a thorough shielding inside of the liquid crystal display panel can be possible. In addition, noise from the driver IC 80 and terminal wirings installed in the terminal area 150 can be shielded.

Embodiment 3

Figure 19:
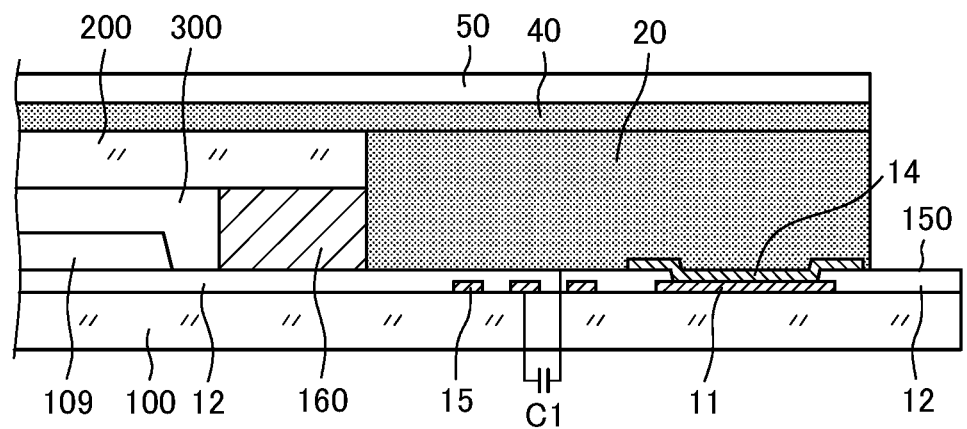
FIG. 19 is a cross sectional view to show a problem to be solved by embodiment 3.

FIG. 19 is a detailed cross sectional view of the terminal area 150. FIG. 19 corresponds to the cross sectional view of FIG. 14 along the line H-H. In FIG. 19, the basic potential terminal 10 is formed from the terminal metal 11 and the protecting conductive film 14 made from ITO covering the terminal metal 11. The terminal metal 11 is used either one of the light shading film 101, gate electrode 105, drain electrode 107, and the source electrode 108. The ITO for the protective conductive film 14 is formed from either one of the ITO for the common electrode and for the pixel electrode, or from both of the ITO for the common electrode and for the pixel electrode.

As shown in FIG. 19, many wirings 15 exist in the terminal area 150. Inorganic protective film of SiO or SiN is used for a protective film 12 to protect those wirings 15. Those inorganic insulating films are used in the display area and have a superior moisture-proof effect. Such inorganic films are formed simultaneously with the under coat 102, the gate insulating film 104, the interlayer insulating film 106 or the capacitance insulating film 111, which are explained in FIG. 4. Which of the inorganic insulation films is chosen depends on which metals are used among the light shading film 101, gate electrode 105, drain electrode 107 or the source electrode 108 for the terminal metal 11. Any events, those inorganic insulating films are very thin as 200 nm or less. As a result, a large capacitance C1 between the terminal wirings 15 and the conductive element 20 is generated. An existence of a large capacitance can be a cause of delay in writing of video signals.

Figure 20:
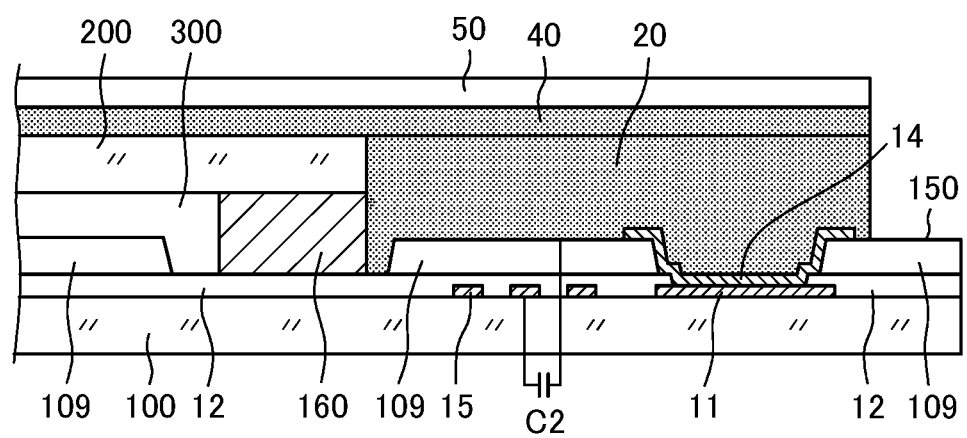
FIG. 20 is a cross sectional view of a first example of embodiment 3.

FIG. 20 is a cross sectional view of the terminal area 150 according to embodiment 3. FIG. 20 corresponds to a cross sectional view of FIG. 14 along the line H-H. In FIG. 20, the organic passivation film 109 formed in the display area 140 is formed also in the terminal area 150 covering the terminal wirings 15. The organic passivation film 109 is formed by e.g. acrylic resin, and made thick as 2 to 4 μm. Therefore, a distance between the terminal wirings 15 and the conductive element 20 can be made larger, consequently, the floating capacitance C2 can be decreased. As a result, an increase in the floating capacitance can be avoided even when the area of the conductive element 20 is made larger.

Figure 21:
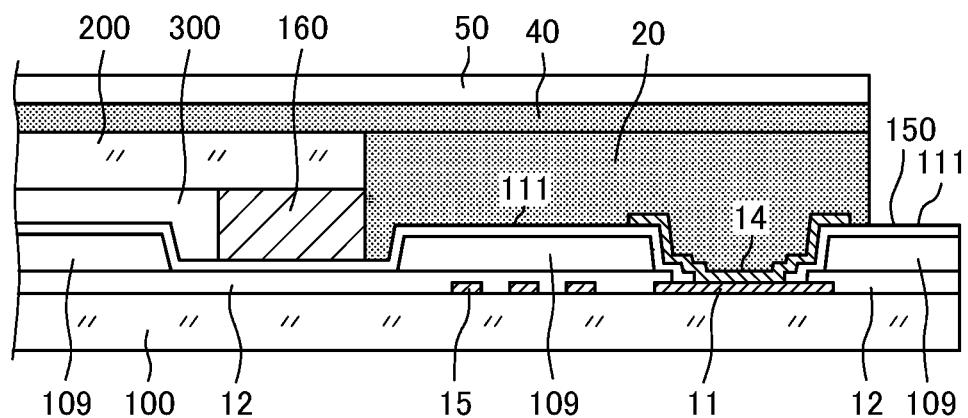
FIG. 21 is a cross sectional view of a second example of embodiment 3.

FIG. 21 is a cross sectional view of the terminal area 150 according to a second example of embodiment 3. FIG. 21 corresponds to a cross sectional view of FIG. 14 along the line H-H. The organic passivation film 109 may absorb moisture in the air and swell, as a result, there is a danger of peel off the organic passivation film 109. The structure of FIG. 21 is to counter measure this problem; a surface of the organic passivation film 109 is covered by second protective film 111. The second protective film 111 in this case is the capacitance insulating film 111. As a result, a danger of peeling off of the organic passivation film 109 due to swell can be avoided.

Figure 22:
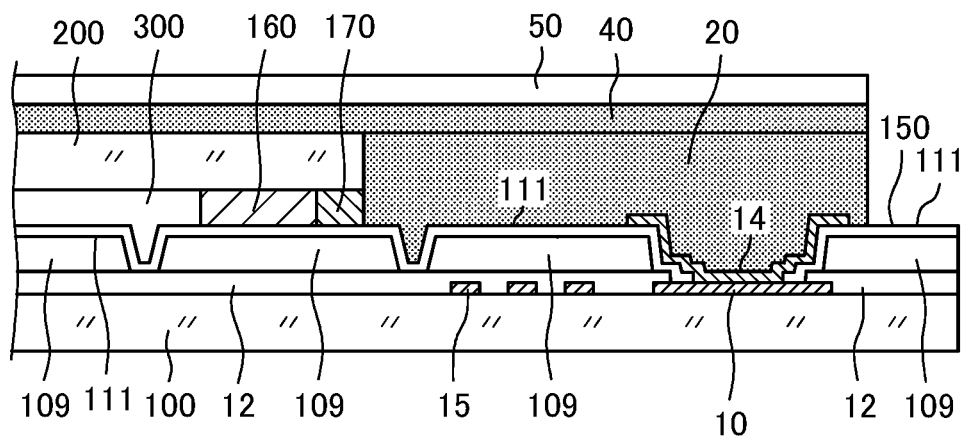
FIG. 22 is a cross sectional view of a third example of embodiment 3.

FIG. 22 is a cross sectional view of the terminal area 150 according to a third example of embodiment 3. FIG. 22 corresponds to a cross sectional view of FIG. 14 along the line H-H. The effect of FIG. 22 is the same as that explained in the example 1 and the example 2 of embodiment 3. Feature of this example is at an edge of the counter substrate 200. The area of the counter substrate 200 corresponding to the terminal area 150 of the TFT substrate 100 must be eliminated; this is made by scribing of a part of the counter substrate 200. However, when a seal material 160 exists at the scribing region, the elimination of an end material of the counter substrate 200 is not performed well. In the structure of FIG. 22, the spacer 170 and the organic passivation film 109 are formed at the edge of the counter substrate 200 so that the end material of the counter substrate 200 is eliminated easily. The spacer 170 extends in a vertical direction to the sheet.

In FIG. 22, the seal material 160 is formed on the organic passivation film 109 and the capacitance insulating film 111, and inside of the spacer 170. The organic passivation film 109 exists in three regions separately, namely, in the inner side than the seal region, in the seal region and in the terminal area 150. According to this structure, moisture can be stopped from invading into the liquid crystal panel through the organic passivation film 109. In addition, the end material of the counter substrate 200 can be easily eliminated, and further, the display area 140 of the liquid crystal display panel can be securely shielded.

Embodiment 4

Figure 23:
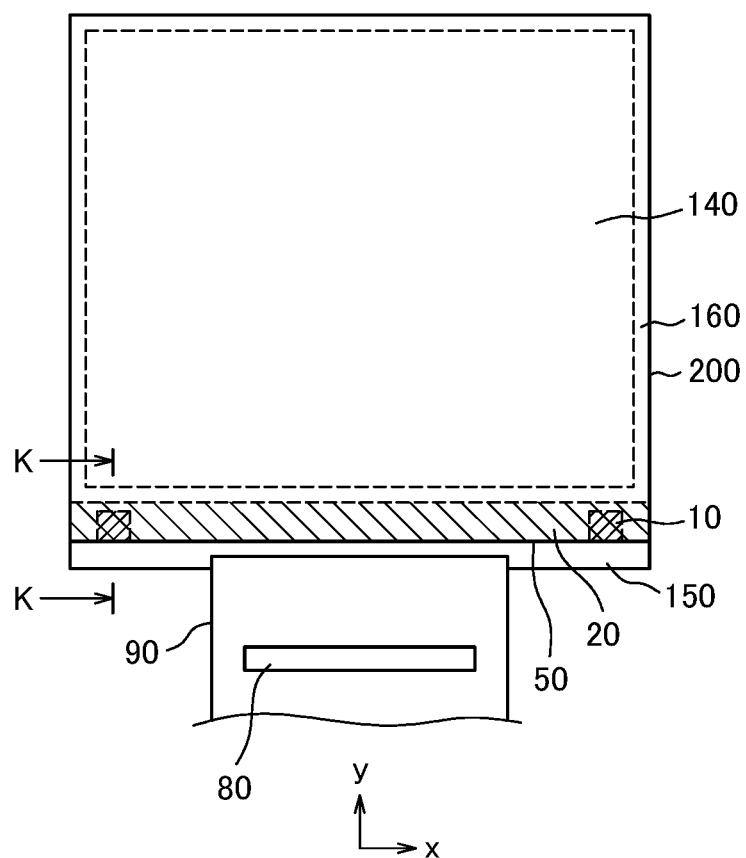
FIG. 23 is a plan view of the liquid crystal display device according to embodiment 4.

FIG. 23 is a plan view of the liquid crystal display device according to embodiment 4 of the present invention. In FIG. 23, the driver IC 80 is installed on the flexible wiring substrate 90 to shrink the area of the terminal area 150. The feature of FIG. 23 is that the conductive element 20 exists in all the area in which the upper polarizing plate 50 exists in the terminal area 150. Therefore, the upper polarizing plate 50 can adhere to the conductive element 20 securely in the terminal area 150, thus, connection problems between the conductive element 20 and the transparent conductive adhesive 40 of the upper polarizing plate 50 can be avoided, and a peel off at the edge of the upper polarizing plate 50 also can be avoided.

In the structure of FIG. 23, too, the organic passivation film 109 is formed in the terminal area 150 as explained in FIGS. 20 to 22 of embodiment 3. Therefore, an increase in a floating capacitance between the conductive element 20 and the terminal wrings 15 can be suppressed. A cross sectional view of FIG. 23 along the line K-K is the same as the cross sectional views of FIGS. 20 to 22 except a length of the upper polarizing plate 50 extending over the terminal area 150 is different.

Embodiment 5

In embodiments 1 to 4, the conductive adhesive is used as the conductive element 20. An adhesive paste can be used for the conductive element 20. Since there are many kinds of adhesive paste, more freedom exists in choosing an optimum substance for the conductive element 20.

Conductive adhesive paste is categorized in two types: one type is that resin itself is conductive, another type is that fine conductive particles of metal or carbon are dispersed in the resin. In both cases, epoxy, acrylic, silicone, urethane and so forth are used. As to the type in which fine conductive particles are dispersed in the resin, the resin is initially liquid of high viscosity, and the volume shrinks during heat curing and so forth; consequently, conductive particles contact each other to show conductivity as the resin.

Figure 24:
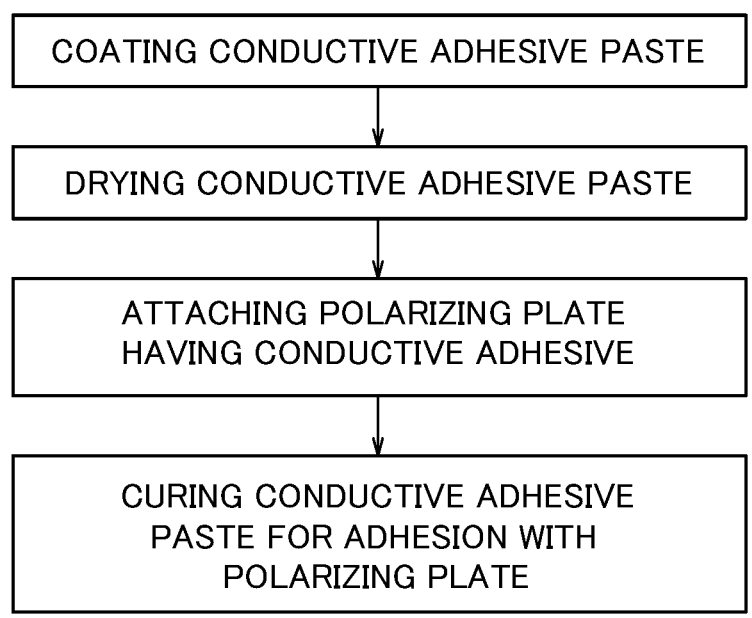
FIG. 24 is a process chart to manufacture the liquid crystal display device according to embodiment 5.

FIG. 24 is an example of a process chart to form the conductive element 20 by the conductive adhesive paste in the terminal area 150. In FIG. 24, the adhesive paste is coated on the terminal area 150 by dispenser or screen printing and so forth. After that, the adhesive paste is dried; then, the upper polarizing plate 50 having the transparent conductive adhesive 40 is adhered to the dried adhesive paste. After that, the dried adhesive paste is hardened by thermosetting or UV curing; subsequently, the conductive element 20, which is formed on the basic potential terminal 10, and the upper polarizing plate 50 are electrically connected to each other.

Even the conductive element 20 is formed from the adhesive paste, plan views of the terminal area 150 are the same as those explained in embodiments 1 through 4.

What is claimed is:

1. A liquid crystal display device comprising:
a TFT substrate and a counter substrate,
a display area formed in an overlapping area of the TFT substrate and the counter substrate,
a terminal area formed on the TFT substrate in which the counter substrate does not overlap, and
a side of the counter substrate adjacent to the terminal area extending in a first direction,
wherein a basic potential terminal, which is to be connected to a basic potential, and terminal wirings are formed in the terminal area,
an IC driver is installed on the terminal area,
an upper polarizing plate having a transparent conductive adhesive is adhered to the counter substrate,
the upper polarizing plate extends in a direction perpendicular to the first direction, and covers a part of the terminal area,
the basic potential terminal is electrically connected with the transparent conductive adhesive of the upper polarizing plate via a conductive element, and
the upper polarizing plate covers the IC driver and is directly in contact with the transparent conductive adhesive, and the upper polarizing plate shields noise from the IC driver.

2. The liquid crystal display device according to claim 1, wherein a width of the conductive element in the first direction is two times a width of the basic potential terminal.

3. The liquid crystal display device according to claim 1, wherein a width of the conductive element in the first direction is three times a width of the basic potential terminal.

4. The liquid crystal display device according to claim 1, wherein the conductive element is formed continuously, in the first direction, from a first side to a second side of the terminal area.

5. The liquid crystal display device according to claim 1, wherein an organic passivation film is formed on the terminal wirings, and the conductive element is formed between the organic passivation film and the transparent conductive adhesive of the upper polarizing plate.

6. The liquid crystal display device according to claim 5, wherein the organic passivation film is formed from a same material of an organic passivation film formed in the display area.

7. The liquid crystal display device according to claim 5, wherein a thickness of the organic passivation film is 2 μm or more.

8. The liquid crystal display device according to claim 5, wherein an inorganic insulating film is formed covering a surface of the organic passivation film.

9. The liquid crystal display device according to claim 1, wherein the conductive element is formed from conductive adhesive.

10. The liquid crystal display device according to claim 1, wherein the conductive element is formed from a same material of the transparent conductive adhesive.

11. The liquid crystal display device according to claim 1, wherein the conductive element is formed from conductive adhesive paste.

12. A liquid crystal display device comprising:
a TFT substrate and a counter substrate, a display area formed in an overlapping area of the TFT substrate and the counter substrate, a terminal area formed on the TFT substrate in which the counter substrate does not overlap, and a side of the counter substrate adjacent to the terminal area extending in a first direction, wherein a basic potential terminal, which is to be connected to a basic potential, and terminal wirings, which emit noise, are formed in the terminal area, an upper polarizing plate having a transparent conductive adhesive is adhered to the counter substrate, the upper polarizing plate extends in a direction perpendicular to the first direction, and covers a part of the terminal area, the basic potential terminal is electrically connected with the transparent conductive adhesive of the upper polarizing plate via a conductive element, an organic passivation film is formed on the terminal wrings, and the conductive element exists between the transparent conductive adhesive of the upper polarizing plate shielding noise emitted from the terminal wirings and the organic passivation film, the conductive element is formed continuously, in the first direction, from a first side to a second side of the terminal area, the basic potential terminal includes a first terminal located on the first side and a second terminal located on the second side, and the first terminal is connected to the second terminal through the conductive element.

13. The liquid crystal display device according to claim 12, wherein the organic passivation film is formed from a same material of an organic passivation film formed in the display area.

14. The liquid crystal display device according to claim 12, wherein the conductive element is formed from conductive adhesive.

15. The liquid crystal display device according to claim 12, wherein the conductive element is formed from a same material of the transparent conductive adhesive.

16. The liquid crystal display device according to claim 12, wherein the conductive element is formed from conductive adhesive paste.

17. A liquid crystal display device comprising:

a TFT substrate and a counter substrate, a display area formed in an overlapping area of the TFT substrate and the counter substrate, a terminal area formed on the TFT substrate in which the counter substrate does not overlap, and a side of the counter substrate adjacent to the terminal area extending in a first direction, wherein a basic potential terminal, which is to be connected to a basic potential, and terminal wirings are formed in the terminal area, an IC driver is installed on the terminal area, an upper polarizing plate having a transparent conductive adhesive is adhered to the counter substrate, a source of noise, the upper polarizing plate extends in a direction perpendicular to the first direction, and covers a part of the terminal area, the basic potential terminal is electrically connected with the transparent conductive adhesive of the upper polarizing plate via a conductive element, and the upper polarizing plate covers the driver IC and directly contact with the transparent conductive adhesive, and the upper polarizing plate shields from noise emitted from the source of noise.

18. The liquid crystal display device according to claim 17, wherein the source of noise is the driver IC.

* * * * *